United States Patent
Agarwal et al.

(10) Patent No.: US 12,266,611 B2
(45) Date of Patent: Apr. 1, 2025

(54) MIXED DENSITY INTERCONNECT ARCHITECTURES USING HYBRID FAN-OUT

(71) Applicant: ADVANCED MICRO DEVICES, INC., Santa Clara, CA (US)

(72) Inventors: Rahul Agarwal, Santa Clara, CA (US); Brett P. Wilkerson, Austin, TX (US); Raja Swaminathan, Austin, TX (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

(21) Appl. No.: 17/084,885

(22) Filed: Oct. 30, 2020

(65) Prior Publication Data
US 2022/0051989 A1    Feb. 17, 2022

Related U.S. Application Data

(60) Provisional application No. 63/064,697, filed on Aug. 12, 2020.

(51) Int. Cl.
*H01L 23/538* (2006.01)
*H01L 23/00* (2006.01)

(52) U.S. Cl.
CPC ...... *H01L 23/5386* (2013.01); *H01L 23/5383* (2013.01); *H01L 24/20* (2013.01); *H01L 24/82* (2013.01); *H01L 2224/2101* (2013.01)

(58) Field of Classification Search
CPC ... H01L 23/5386; H01L 23/383; H01L 24/20; H01L 24/82; H01L 2224/2101
See application file for complete search history.

(56) References Cited

U.S. PATENT DOCUMENTS

| | | | |
|---|---|---|---|
| 9,653,428 B1* | 5/2017 | Hiner | H01L 24/96 |
| 2011/0316155 A1* | 12/2011 | Ko | H01L 23/5389 |
| | | | 257/738 |
| 2014/0091474 A1 | 4/2014 | Starkston et al. | |
| 2015/0364405 A1* | 12/2015 | Kunimoto | H01L 23/552 |
| | | | 174/251 |
| 2015/0364422 A1 | 12/2015 | Zhai et al. | |
| 2017/0011993 A1* | 1/2017 | Zhao | H01L 23/49838 |
| 2017/0271307 A1 | 9/2017 | Hiner et al. | |
| 2018/0053730 A1* | 2/2018 | Shao | H01L 23/544 |
| 2018/0102251 A1 | 4/2018 | Delacruz et al. | |
| 2018/0358298 A1* | 12/2018 | Zhai | H01L 25/0655 |
| 2018/0374804 A1* | 12/2018 | Zhang | H05K 1/0219 |
| 2019/0244905 A1* | 8/2019 | Yu | H01L 21/6835 |
| 2019/0311983 A1* | 10/2019 | Raorane | H01L 23/00 |

(Continued)

FOREIGN PATENT DOCUMENTS

EP    3301714 A1    4/2018

OTHER PUBLICATIONS

International Search Report and Written Opinion, PCT/US2021/045665, Dec. 1, 2021, 13 pages.

*Primary Examiner* — Kyoung Lee
*Assistant Examiner* — Christina A Sylvia

(57) ABSTRACT

A semiconductor module includes two or more semiconductor dies and an interconnect structure coupled to the two or more semiconductor dies. The interconnect structure implements a plurality of die-to-die connection pathways having a first density and a plurality of fan-out redistribution pathways having a second density that is different from the first density.

19 Claims, 16 Drawing Sheets

(56) References Cited

U.S. PATENT DOCUMENTS

| | | |
|---|---|---|
| 2019/0312019 A1 | 10/2019 | Pietambaram et al. |
| 2019/0319626 A1 | 10/2019 | Dabral et al. |
| 2020/0075488 A1* | 3/2020 | Wu .................. H01L 23/53295 |
| 2020/0395308 A1* | 12/2020 | Wu ....................... H01L 21/563 |
| 2021/0074645 A1* | 3/2021 | Tsai ........................ H01L 25/50 |
| 2021/0134724 A1 | 5/2021 | Rubin et al. |
| 2021/0134728 A1* | 5/2021 | Rubin ................. H01L 21/4853 |

\* cited by examiner

Couple A First Die To A Second Die Using A First Plurality Of Interconnects Having A First Density  1102

Couple The First Die To A Peripheral Module Using A Second Plurality Of Interconnects Having A Second Density That Is Different From The First Density  1104

MIXED DENSITY INTERCONNECT ARCHITECTURES USING HYBRID FAN-OUT

CROSS-REFERENCE TO RELATED APPLICATION

This application is a non-provisional application for patent entitled to a filing date and claiming the benefit of earlier-filed U.S. Provisional Patent Application Ser. No. 63/064,697, filed Aug. 12, 2020.

BACKGROUND

A System-on-a-Chip (SoC) integrates multiple nodes of functionality in a single integrated circuit. For example, a SoC may include one or more processor cores, memory interfaces, network interfaces, optical interfaces, digital signal processors, graphics processors, telecommunications components, and the like. Traditionally, each of the nodes are created in a monolithic die. However, for various reasons such as increasing the yield of functional chips or reducing design complexity and cost, it is increasingly more common to separate these nodes into individual die and reconstitute them on a wafer. To achieve the efficiency and performance of a monolithic die, these individual dies must be highly interconnected. As the sizes of dies shrink and/or the number of input/output pins increases, it is becoming increasingly difficult to scale this connectivity.

DETAILED DESCRIPTION

Figure 1:
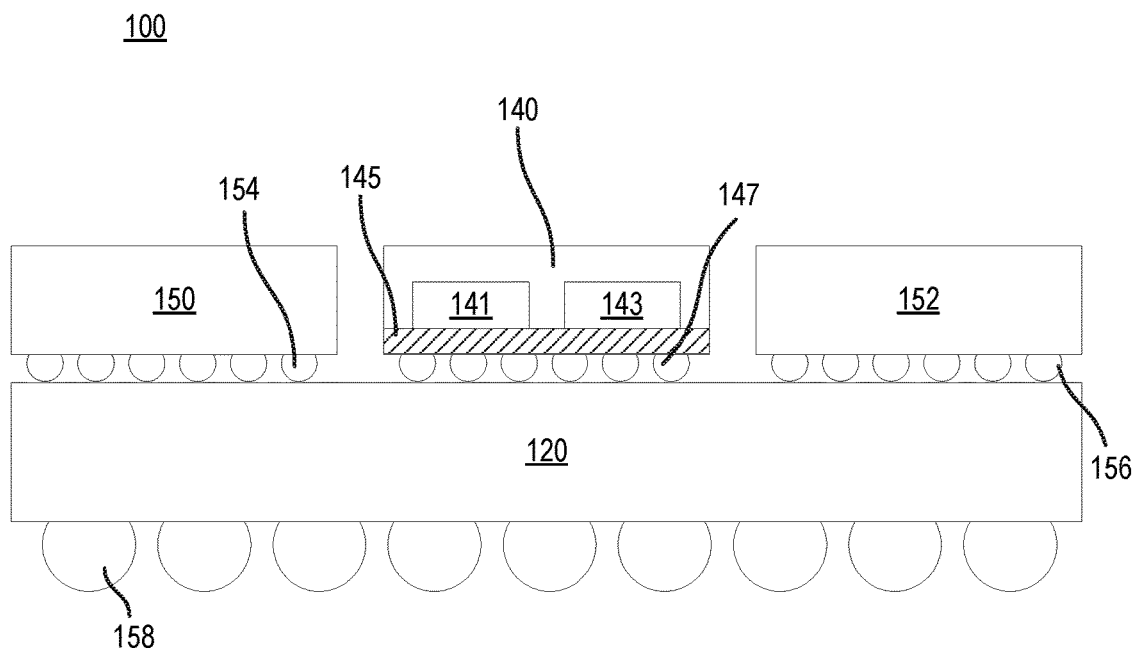
FIG. 1 sets forth a block diagram of an example semiconductor device implementing mixed density interconnect architectures utilizing hybrid fan-out according to embodiments of the present disclosure.

One approach to SoC design and component reuse is the notion of a "chiplet." A "chiplet" is a semiconductor die containing one or more nodes, such as a functional block or intellectual property (IP) block, that has been specifically designed to work with other chiplets to form larger more complex chips. To modularize system design and reduce complexity, these chiplets often include reusable IP blocks. The integration of various heterogenous chiplets in a single system can be challenging. For example, various types of chiplets may have different connection density requirements and/or capabilities.

One approach to chiplet integration may be to arrange chiplets in a 2.5D package that uses a silicon interposer. However, the design and fabrication of silicon interposers is expensive and does not lend itself to conventional uses as well as modularization.

Another approach to chiplet integration may be to use die-first fan-out packaging (e.g., integrated fan-out) where interconnections between the dies are created after the dies have been reconstituted. However, such a package is not compatible with external stacked devices such as a high bandwidth memory module.

Yet another approach to chiplet integration may be to use die-last fan-out packaging (e.g., chip-on-wafer-on-substrate) where interconnections between the dies are created on a wafer before the dies have been reconstituted. However, this approach is limited in both input/output connection density and cost.

Still another approach to chiplet integration may be to use a silicon bridge die (e.g., high density cross link or embedded interconnect bridge) between dies. However, power delivery to the bridge die can be a challenge, as well as scalability to less than a 35 μm bump pitch.

To address these challenges, various embodiments according to the present disclosure provide a mixed density of interconnection between dies that allows some chiplets to be tightly coupled with ultra-high density connection pathways, for increased input/output performance, while other chiplets may be less tightly coupled with high density connection pathways, for scalability and compatibility with external devices.

An embodiment in accordance with the present disclosure is directed to semiconductor module that includes two or more semiconductor dies, and an interconnect structure coupled to the two or more semiconductor dies such that the interconnect structure implements a plurality of die-to-die connection pathways having a first density and a plurality of fan-out redistribution pathways having a second density that is different from the first density.

In some implementations, the interconnect structure includes a redistribution layer fabricated on the two or more dies. In other implementations, the interconnect structure includes a redistribution layer fabricated on an interposer that is coupled to the two or more dies.

In some implementations, each of the two or more dies includes a die interface including a mixed density of input/output interconnects. In these implementations, a plurality of interconnects for the die-to-die connection pathways may have a pitch that is substantially finer than a pitch of a plurality of interconnects for the fan-out redistribution pathways.

In some implementations, at least a portion of the fan-out redistribution pathways terminate with a module interconnect structure, where the module interconnect structure is adapted to connect the semiconductor module to another device.

An embodiment in accordance with the present disclosure is directed to a semiconductor device that includes a semiconductor module including a first interconnect structure that implements a first plurality of connection pathways connecting a first die to a second die, where the first plurality of connection pathways has a first density. The semiconductor device also includes a second interconnect structure connecting the semiconductor module to at least one peripheral component, where the second interconnect structure implements a second plurality of connection pathways between the first die and the peripheral component, and where the second plurality of connection pathways having a second density that is different from the first density.

In some implementations, the first interconnect structure includes a redistribution layer fabricated on the first die, the second die, and a mold layer supporting the first die and second die. In other implementations, the first interconnect structure includes a redistribution layer fabricated on an interposer that is coupled to the first die and the second die. In some implementations, at least the first die includes a die interface including a mixed density of input/output interconnects.

In some implementations, a plurality of interconnects for the die-to-die connection pathways may have a pitch that is substantially finer than a pitch of a plurality of interconnects for the second plurality of connection pathways. In some implementations the second interconnect structure includes an interconnect die in the second plurality of connection pathways. In some implementations, the interconnect die is connected to the semiconductor module and to the peripheral module through a redistribution layer formed on a surface of the second interconnect structure. In some implementations, the second interconnect structure includes a wafer-level fan-out redistribution structure fabricated on an interposer.

Another embodiment in accordance with the present disclosure is directed to a method of mixed density interconnect architectures utilizing hybrid fan-out that includes coupling a first die to a second die using a first plurality of interconnects having a first density, and coupling the first die to a peripheral module using a second plurality of interconnects having a second density that is different from the first density.

In some implementations, coupling a first die to a second die using a first plurality of interconnects having a first density includes bonding the first die and the second die to a redistribution layer of an interposer using hybrid bonding. In some implementations, coupling a first die to a second die using a first plurality of interconnects having a first density includes fabricating a redistribution layer on the first die and the second die. In some implementations, coupling the first die to a peripheral module using a second plurality of interconnects having a second density that is different from the first density includes coupling an interconnect die to the first die and to the peripheral module. In some implementations, coupling the first die to a peripheral module using a second plurality of interconnects having a second density that is different from the first density includes coupling the first die to the peripheral module using a wafer-level fan-out structure of an interposer. In various implementations, at least the first die includes a die interface including a mixed density of input/output interconnects.

FIG. 1 sets for a block diagram illustrating an example architecture of a semiconductor device (100) according to various embodiments of the present disclosure. In some examples, the example semiconductor device (100) may be a system in a package (SiP) device or other advanced technology semiconductor package. The semiconductor device (100) may include multiple heterogeneous components, including processor modules and memory modules, integrated in a single package. In the example of FIG. 1, the semiconductor device (100) includes multiple solder structures (158) (e.g., solder bumps) disposed on the surface of the interconnect structure (120), which are exposed for connection to a sub state, printed circuit board (PCB), card, or other external component. The example semiconductor device (100) be implemented in a variety of computing devices, including mobile devices, personal computers, peripheral hardware components, gaming devices, set-top boxes, and the like.

In the example depicted in FIG. 1, the semiconductor device (100) includes a semiconductor module (140) that includes two or more semiconductor dies (141, 143) such as semiconductor chips or chiplets. For example, the semiconductor module (140) may be a multi-die package or similar semiconductor package. The semiconductor module (140) also includes a module-level interconnect structure (145) that includes connections between the two or more semiconductor dies (141, 143) as well as connections between the two or more semiconductor dies (141, 143) and solder structures (147) disposed on the outward face of the interconnect structure (145) for connecting the semiconductor module (140) to the interconnect structure (120). In one example, the semiconductor module (140) is a hybrid fan-out package where the package is treated as if it were a single die its connection with the interconnect structure (145), while the interconnect structure (145) tightly integrates the connections between the semiconductor dies (141, 143). As will be explained in greater detail below, in some implementations the interconnect structure (145) may include a redistribution layer that is formed after the two or more semiconductor dies (141, 143) have been reconstituted and molded, while in other implementations the interconnect structure may include a redistribution layer of an interposer wafer. As will also be explained in greater detail below, the interconnect structure (145) includes a mixed density of connections such that the connections between two semiconductor dies (141, 143) have a higher connection density than the connections between the each semiconductor die (141, 143) and the solder structures (147). The interconnect structure (145) may employ a fan-out of conductive traces to areas of the interconnect structure (145) on which the solder structures (147) are disposed.

In the example depicted in FIG. 1, the semiconductor device (100) includes one or more peripheral modules (150, 152). In various examples, a peripheral module (150, 152) may include memory modules, accelerators, PCIe or other fabric interfaces, optics modules, or other package components or combinations thereof. In one example, a peripheral module (150, 152) is a memory interface module, such as a high bandwidth memory module (HBM), that includes a memory interface die (e.g., a chiplet) and stacked memory devices. The peripheral modules (150, 152) may include various dies, integrated circuited, memory devices, passive components, interconnects, buses, and the like, which are not depicted. In the example of Figure, the peripheral modules (150, 152) are electrically and physically coupled to the package-level interconnect structure (120) by solder structures (154, 156) such as solder bumps.

In the example depicted in FIG. 1, the interconnect structure (120) couples the two or more semiconductor dies (141, 143) of the semiconductor module (140) to the two or more peripheral modules (150, 152). The example of FIG. 1 depicts that the integrated circuit (141) is connected to the peripheral module (150) through the interconnect structure (120), and that the integrated circuit (143) is connected to the peripheral module (152) through the interconnect structure (120); however, it will be appreciated that other layouts may be employed. For example, each die may be connected to one or more other integrated circuits and one or more peripheral modules. In one implementation, the interconnect structure (120) includes a fan-out redistribution layer structure to which the semiconductor module (140) and the peripheral modules (150, 152) are bonded, as will be explained in greater detail below. In another implementation, the interconnect structure (120) includes a silicon bridge die that is coupled connected to a die of the semiconductor module (140) and to a peripheral module (150, 152) through a redistribution layer to which the semiconductor module (140) and the peripheral modules (150, 152) are bonded, as will be explained in greater detail below. In some examples, the interconnect structure (120) includes solder structure (158) for coupling the semiconductor device (100) to another device, wafer, substrate, or circuit board.

Figure 2:
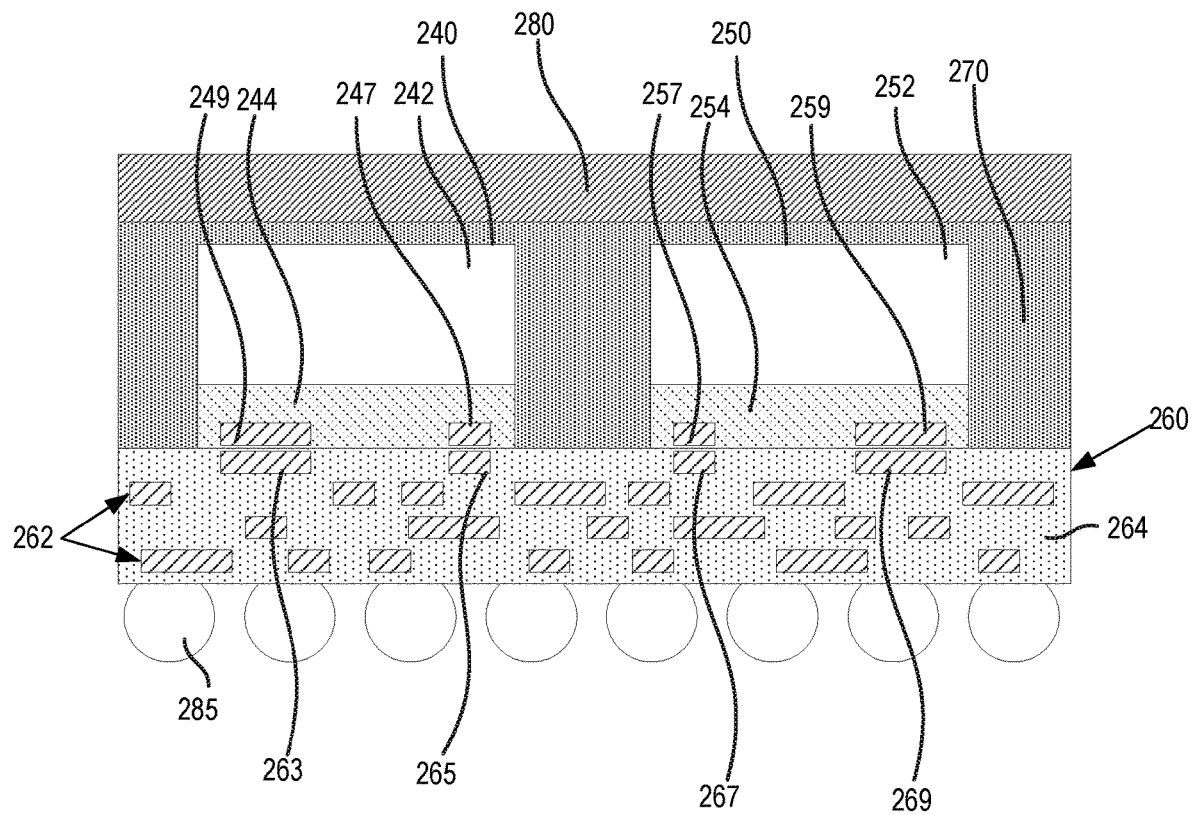
FIG. 2 sets forth a block diagram of an example semiconductor module for mixed density interconnect architectures utilizing hybrid fan-out according to some embodiments of the present disclosure.

For further explanation, FIG. 2 sets forth a cross-sectional diagram of an example implementation of a semiconductor module (200) according to various embodiments of the present disclosure. In some implementations, the example implementation of a semiconductor module (200) depicted in FIG. 2 may be employed as the semiconductor module (140) of FIG. 1. The example semiconductor module (200) of FIG. 2 includes two or more dies (240, 250) disposed on an interposer (260) and encapsulated in an inorganic encapsulant layer (270) that may be, in some implementations, capped with a silicon cap wafer (280). The example semiconductor module (200) of FIG. 2 may be created, for example, by a "die last" fabrication process in which connection routing within redistribution layers of the interposer (260) is completed before the die (240, 250) are bonded to the interposer (260), and in which the encapsulant layer (270) and cap wafer (280) are added before dicing, as will be explained in greater detail below.

In the example depicted in FIG. 2, each of the two or more dies (240, 250) includes a substrate (242, 252), which may be constructed of silicon, germanium, or other types of semiconductor materials, and which include various functional logic blocks, logic gates, clocks, buses, and other elements formed in the substrate as will be appreciated by those of skill in the art. Each of the two or more dies (240, 250) also includes a die interface (244, 254) (e.g., a die-level build-up structure such as a back end of line (BEOL) layer created during die fabrication) that includes layers of metallization and inter-level dielectric layers, as well as conductor structures such as vias, traces, and pads. Each of the die interfaces (244, 254) includes a number of metal contacts for conveying power, ground, input signals, and output signals that may bonded to counterpart metal contacts disposed on the surface of the interposer (260). In one example, each of the die interfaces (244, 254) includes an group of metal contacts that are input/output signal pads (247, 249, 257, 259) (referred to herein as "I/O pads") having a finer pitch (e.g., less than 10 μm) I/O pads for die-to-die connections and a group of I/O pads having a coarser pitch (45 μm to 55 μm) for die-to-peripheral connections, thus allowing for a higher density of die-to-die connections than the density of connections between each die and the interconnect structures (285) of the interposer (260) on the outward face of the semiconductor module (200), as will be further explained below. Readers will appreciate that the terms "fine" or "finer" and "coarse" or "coarser" are used herein as relative terms that compare the pitches of I/O pads, and should not be construed as imparting a particular pitch or range of pitches, or as ascribing an absolute value to the terms.

In the example depicted in FIG. 2, the interposer (260) implements a redistribution layer structure that includes layers of metallization and inter-level dielectric layers. For example, the interposer (260) may be a wafer-level build-up structure such as a BEOL layer created during interposer wafer fabrication, where the silicon of the interposer wafer is removed to leave only the interposer (260). The redistribution layer structure of the interposer (260) may include multiple layers of conductor structures (262), such as traces, pads, vias and other types of conductor structures suitable for fabrication, and multiple interlevel dielectric layers (264). In various examples, the conductor structures (262) can be constructed of copper, aluminum, gold, platinum, palladium, combinations of such or other conductors, and be fabricated using well-known material deposition techniques, such as, plating, sputtering, chemical vapor deposition, combinations of these or the like and patterned as necessary using well-known photolithography and directional etching techniques. The interlevel dielectric layers (264) can be constructed of glass(es) such as SiOx or other types of interlevel dielectric layer materials.

In some implementations, disposed on the inward face of the interposer (260) are multiple metal contacts that include signal pads (263, 265, 267, 269) aligned with counterpart to the I/O pads (247, 249, 257, 259) of the die interfaces (244, 254) and that are formed corresponding pitches. In one example, the conductor structures (262) are fabricated with fine line widths and spacings, on the order of 1.0 µm or less, which can provide high density interconnect pathways between the relatively fine pitch signal pads. In this example, some conductor structures may fan-out interconnect pathways with a lower density from the relatively coarse pitch signal pads, which allows the interconnect pathways to scale out to accommodate connection to the interconnect structures (285). In these examples, some of the conductor structures (262) of the interposer implement high density connections between the group of higher density, finer pitched I/O pads (247, 257) of the semiconductor dies (240, 250) and a lower density connection between the lower density, coarser pitched I/O pads (249, 259) and interconnect structures (285) on the opposing face of the interposer (260) for connecting the semiconductor module (240) to a board, wafer, package, or other component. In the example implementation depicted in FIG. 2, the interposer (260) may be employed as the module-level interconnect structure (145) of the example semiconductor device (100) depicted in FIG. 1.

In some implementations, the semiconductor dies (240, 250) are electrically and physically coupled to the interposer (260) through a hybrid bonding technique. In one example, a dielectric bond (e.g., oxide bond) is formed between each semiconductor die (240, 250) and the interposer (260) by applying a dielectric substance between each semiconductor die (240, 250) and the interposer (260). In this example, when heat is applied, metal contacts (e.g., I/O pads (247, 249, 257, 259)) of each semiconductor die (240, 250) and the metal contacts (e.g., signal pads (263, 265, 267, 269)) of the interposer (260) expand. As the metal interconnects of each the semiconductor die (240, 250) and the interposer (260) are aligned, their expansion causes the aligned metal interconnects to come into contact and bond, thereby forming the metal interconnect bond of the hybrid bond. Thus, a bond is formed by the dielectric substance and the expanded and bonded metal interconnects. The area between and around the semiconductor die may be filled with an oxide fill material forming the encapsulant layer (270).

In another example of hybrid bonding, an interconnect between each semiconductor die (240, 250) and the interposer (260) is made up of a metallurgical bond between the I/O pads (247, 249, 257, 259) of the die and the signal pads (263, 265, 267, 269) of the interposer. In addition, an insulating bonding layer joins each semiconductor die (240, 250) to the interposer (260) and includes a glass layer, such as SiOx, of the die and another glass layer, such as silicon oxynitride, of the interposer. The I/O pads (247, 249, 257, 259) and the signal pads (263, 265, 267, 269) are metallurgically bonded by way of an anneal process. In this regard, each semiconductor die (240, 250) is brought down or otherwise positioned on the interposer structure so that the glass layer of each semiconductor die (240, 250) is on or in very close proximity to the silicon oxynitride layer and the I/O pad (247, 249, 257, 259) is on or in very close proximity to the signal pad (263, 265, 267, 269). Thereafter, an anneal process is performed, which produces a transitory thermal expansion of the I/O pads (247, 249, 257, 259) and signal pads (263, 265, 267, 269), bringing those structures into physical contact and causing them to form a metallurgical bond that persists even after cooling. The area between and around the semiconductor die may be filled with an oxide fill material forming the encapsulant layer (270).

Figure 3:
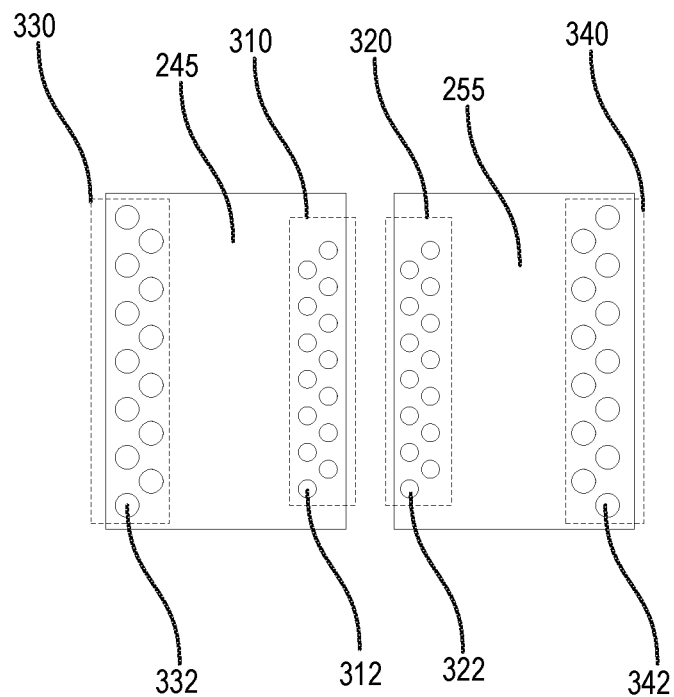
FIG. 3 sets forth a block diagram of a semiconductor die interface for mixed density interconnect architectures utilizing hybrid fan-out according to some embodiments of the present disclosure.

For further reference, FIG. 3 sets forth an exemplary configuration (300) of the example die interfaces (245, 254) of FIG. 2, in accordance with various embodiments of the present disclosure. In one example, the I/O pads of each of the die interfaces (244, 254) includes, inter alia, one or more ultra-high density arrays (310, 320) of I/O pads (312, 322) for die-to-die connection and one or more high-density arrays (330, 340) of I/O pads (332, 342) for die-to-peripheral connections. In this example, the array (310) of I/O pads (312) includes a number of pads disposed at the periphery of the semiconductor chip die (240), proximate to the opposing semiconductor die (250), for conveying input and output signals to and from the semiconductor die (250). In this example, the array (320) of I/O pads (322) includes a number of pads disposed at the periphery of the semiconductor die (250), proximate to the opposing semiconductor die (240), for conveying input and output signals to and from the semiconductor die (240). In this example, the arrays (330, 340) of I/O pads (332, 342) includes a number of pads disposed at the periphery of the semiconductor dies (240, 250) for conveying external input and output signals to and from the semiconductor module (200). Readers will appreciate that, while only I/O pads are depicted, other pads for conveying power, ground, or other signals may be present.

In some implementations, the pitch of the ultra-high density I/O pads (312, 322) is substantially finer than the pitch of the high-density I/O pads (332,342). In some examples, the pitch of the I/O pads (312, 322) in the first and second arrays (310, 320) may be 5 µm to 10 µm. In some examples, the pitch of the I/O pads (332, 342) in the high density arrays (330, 340) may be 45 µm to 55 µm. Readers will appreciate that the ultra-high density arrays (310, 320) allow for a higher connection density for chip-to-chip communication, while the high density arrays may accommodate a lower connection density for connection of the semiconductor module (e.g., through solder bumps) to a wafer level fan-out structure. In this way, an integrated fan-out interconnect between the semiconductor dies (240, 250) may be used in conjunction with a wafer level fan-out to support interconnection of the semiconductor dies (240, 250) within the module (200) to a peripheral component (e.g., a high bandwidth memory module).

For further explanation, FIGS. 4A-F set forth an example process flow for constructing a semiconductor module, such as the example implementation of a semiconductor module (200) depicted in FIG. 2, according to various embodiments. For example, the example process flow set forth in FIGS. 4A-F may be a "die last" where multiple dies are packaged on an interposer and then the package is diced into individual packages each containing a die or group of dies. In some examples, the dies may be grouped such that each group includes the same set of dies. In these examples, to facilitate the dicing process, groups of dies may be clustered such that the physical distance between each die in the group (e.g., 20-50 µm) is shorter than the distance between two groups of dies.

Figure 4A:
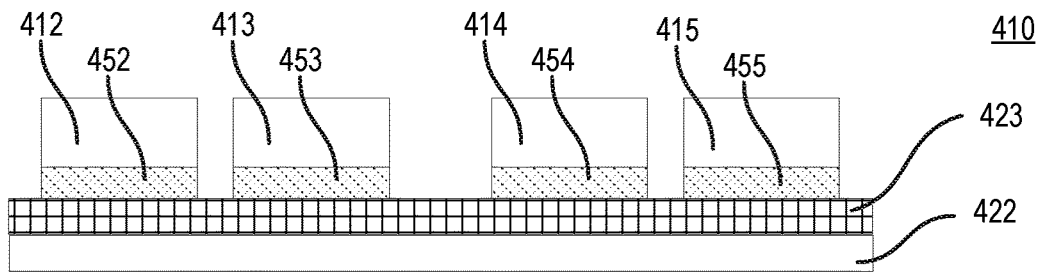
FIG. 4A is a portion of an example process flow for fabricating mixed density interconnect architectures utilizing hybrid fan-out according to some embodiments.

Beginning with FIG. 4A, at 410, dies (412, 413, 414, 415) are bonded to an interposer wafer (422). In one example, bonding dies (412, 413, 414, 415) to an interposer wafer (422) is carried out by flipping the dies (412, 413, 414, 415) such that the die interfaces (452, 453, 454, 455) contact the interposer layer (423) of the interposer wafer (422) and performing a hybrid bonding technique as described above. Die to die connectivity is achieved by fine line connection pathways in the interposer layer (423). As explained above a group of fine pitch I/O pads of the (412, 413, 414, 415) are bonded to counterpart signal pads on the interposer layer (423), and a group of course pitch I/O pads are bonded to counterpart signal pads on the interposer layer (423), among other bonded interconnect structures. The interposer layer (423) includes redistribution layer structures formed during a wafer fabrication process. One advantage of fabricating the interposer layer (423) on the interposer wafer (422) separate and apart from the initial fabrication of the semiconductor dies (412, 413, 414, 415), is that the redistribution layer structure can more extensive than the footprints of the dies (412, 413, 414, 415).

Figure 4B:
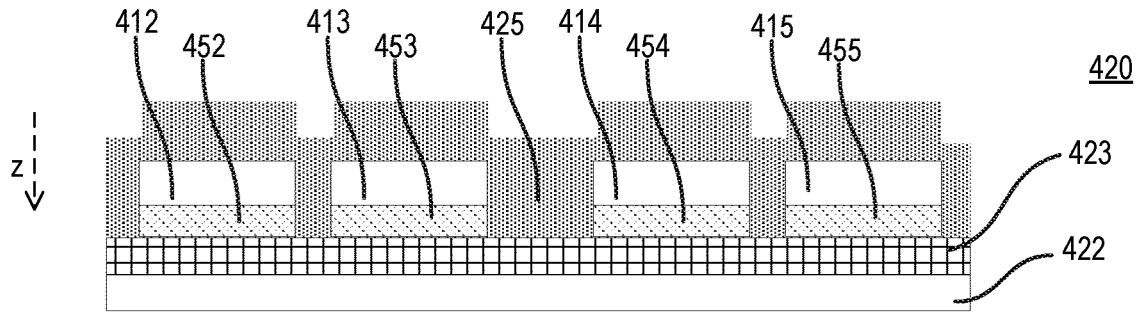
FIG. 4B is a portion of an example process flow for fabricating mixed density interconnect architectures utilizing hybrid fan-out according to some embodiments.

Moving to FIG. 4B, at step, 420, device thinning and gap filling are performed. In one example, device thinning and gap filling are carried out by grinding the silicon substrate of the dies (412, 413, 414, 415) to reduce the z-direction height and filling in the area between the dies (412, 413, 414, 415) with an inorganic encapsulant material (425) (e.g., silicon oxide). The encapsulant material (425) is deposited over the semiconductor dies (412, 413, 414, 415), and the otherwise exposed portions of the interposer layer (423).

Figure 4C:
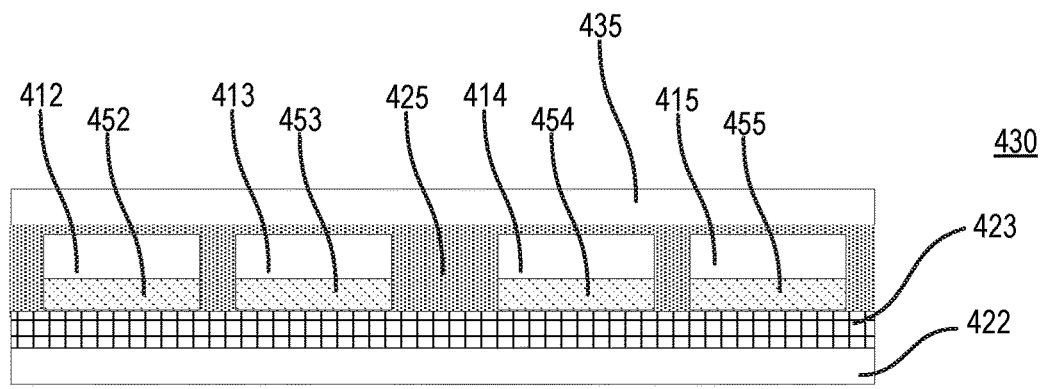
FIG. 4C is a portion of an example process flow for fabricating mixed density interconnect architectures utilizing hybrid fan-out according to some embodiments.

Moving to FIG. 4C, at step 430, surface planarization and capping are performed. In one example, surface planarization and capping are carried out by smoothing the surface of the encapsulant material (425) and bonding a silicon cap wafer (435) to the surface of the encapsulant material. The encapsulant material (425) is thinned (e.g., by chemical mechanical polishing (CMP)) to leave a thin portion material above the semiconductor dies (412, 413, 414, 415). The interposer wafer (522) provides mechanical support and protection, for example, during both the grinding and CMP processes.

Figure 4D:
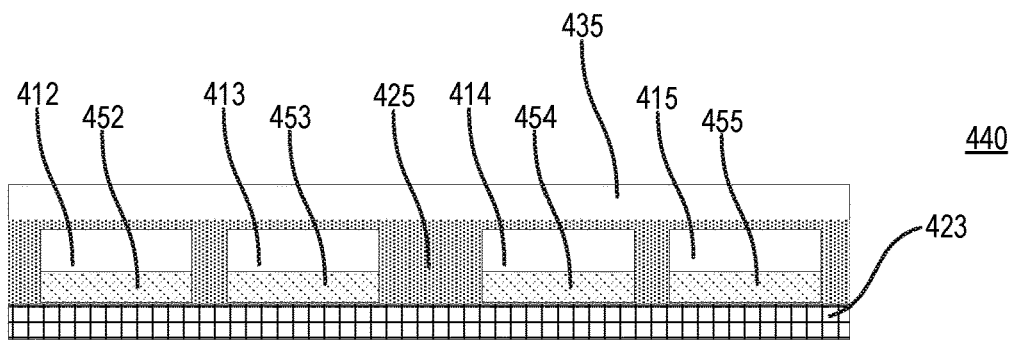
FIG. 4D is a portion of an example process flow for fabricating mixed density interconnect architectures utilizing hybrid fan-out according to some embodiments.

Moving to FIG. 4D, at step 440, the interposer layer (423) is exposed. In one example, exposing the interposer layer (423) is carried out by grinding or etching the silicon of the interposer wafer (422) until the metallization layers of the interposer layer (423) are exposed. The grinding process removes the majority of the interposer wafer (422).

Figure 4E:
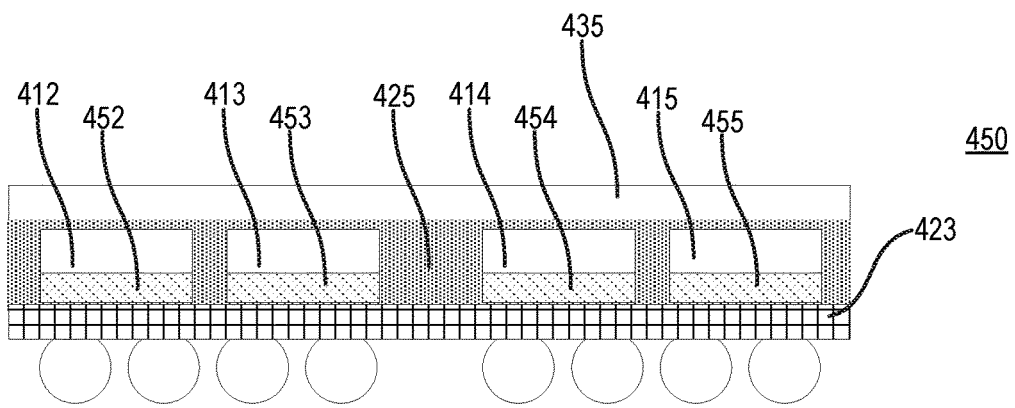
FIG. 4E is a portion of an example process flow for fabricating mixed density interconnect architectures utilizing hybrid fan-out according to some embodiments.

Moving to FIG. 4E, at step 450, redistribution layer processing and bumping are performed. In one example, redistribution layer processing and bumping are carried out by processing redistribution layer structures and terminal metal on the exposed face of the interposer layer (423) and attaching conductive interconnect structures (e.g., solder bumps) to the redistribution layer structure. In this example, an etch back process may be used to expose portions of the lowermost metallization layer of the interposer layer (423) in preparation for attachment of the interconnects (485), such as the interconnect structures (285) depicted in FIG. 2. For example, the etch back may be performed as a dry etch with plasma enhancement. Directional etching may be desired in order to establish relatively vertical sidewalls of any openings leading to the lower most metallization of the interposer (260). In these examples, the interconnects (485) are attached to the redistribution layer structure with the cap wafer (435) providing support. In some examples, the mounting can be accompanied by or performed in conjunction with the fabrication of underbump metallization (UBM).

Figure 4F:
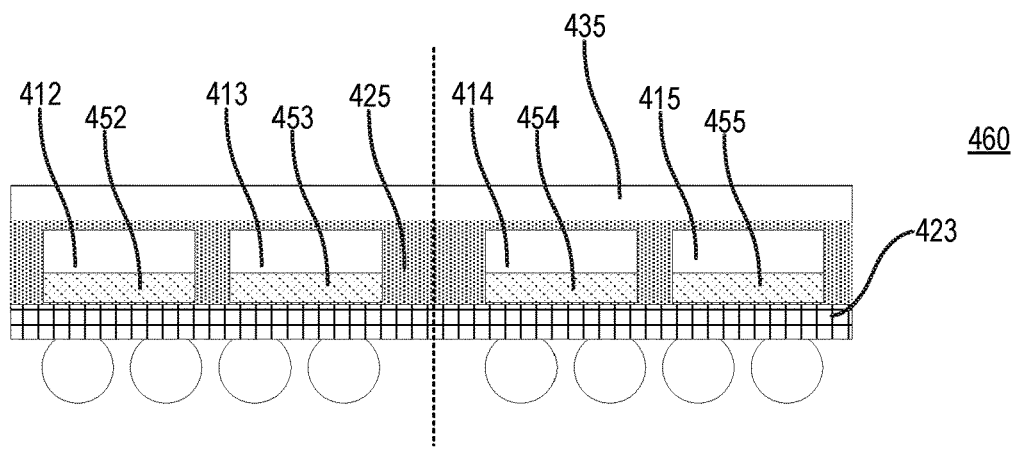
FIG. 4F is a portion of an example process flow for fabricating mixed density interconnect architectures utilizing hybrid fan-out according to some embodiments.

Moving to FIG. 4F, at step 460, dicing is performed. In one example, dicing is carried out by a singulation process in which the cap wafer (435) and individual groupings of semiconductor dies (412, 413) and (414, 415) undergo singulation to yield the fan-out package (461) and another fan-out package (462), which consists of the semiconductor dies and their associated interposer/redistribution layer structures. At this point, the fan-out packages (461) and (462) can be mounted to a circuit board, wafer, package, or other interconnect structure.

Figure 5:
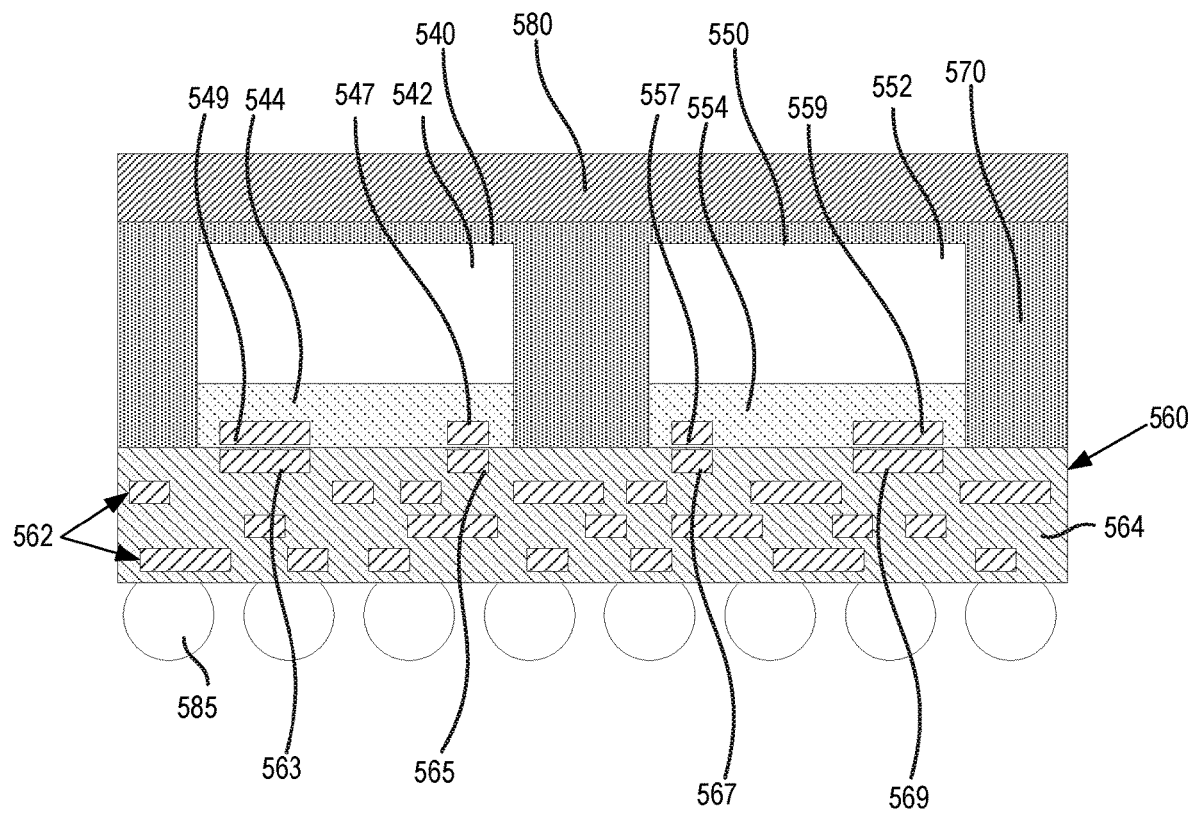
FIG. 5 sets forth a block diagram of an example semiconductor module for mixed density interconnect architectures utilizing hybrid fan-out according to some embodiments of the present disclosure.

For further explanation, FIG. 5 sets forth a cross-sectional diagram of an example implementation of a semiconductor module (500) in accordance with the present disclosure. In some implementations, the example implementation of a semiconductor module (500) depicted in FIG. 5 may be employed as the semiconductor module (140) of FIG. 1. The example semiconductor module (500) of FIG. 5 includes two or more integrated circuits, i.e., two or more dies (540, 550) having disposed thereon a fab-like redistribution layer structure (560) and encapsulated in an inorganic encapsulant layer (570), which are all supported by a carrier (580) (e.g., a glass carrier). The example semiconductor module (500) of FIG. 5 may be created, for example, by a "die first" fabrication process in which connection routing within the redistribution layer structure (560) are completed after the dies (540, 550) are reconstituted and in which the encapsulant layer (570) and carrier (580) are added after dicing, as will be explained in greater detail below.

In the example depicted in FIG. 5, each of the two or more dies (540, 550) may be similarly configured as the two or more dies (240, 250) depicted in FIG. 2. Each of the two or more dies (540, 550) also includes a substrate (542, 552) that may be similarly configured as the substrates (242, 252) depicted in FIG. 2. Each of the two or more dies (540, 550) also includes a die interface (544, 554) that may be similarly configured as the dies interfaces (244, 254) depicted in FIG. 2, in that the die interfaces (544, 554) also includes relatively fine pitch I/O pads (547, 557) having a finer pitch (e.g., less than 10 µm) I/O pads for die-to-die connections than a group of I/O pads (549, 559) having a relatively coarser pitch (e.g., 45 µm to 55 µm) for die-to-peripheral connections, thus allowing for a higher density of die-to-die connections than the density of connections between each die and the interconnect structures (585) of the redistribution layer structure (560) on the outward face of the semiconductor module (500), as will be further explained below.

In the example depicted in FIG. 5, the redistribution layer structure (560) includes layers of metallization and interlevel dielectric layers. For example, the redistribution layer structure (560) may be a build-up structure formed on the surface of an encapsulant layer (570) containing the dies (540, 550) such that the surface of the encapsulant structure is coplanar the exposed active surface of the dies. The redistribution layer structure (560) may include multiple layers of conductor structures (562), such as traces, pads, vias and other types of conductor structures suitable for fabrication, and multiple interlevel dielectric layers (564). In various examples, the conductor structures (562) can be constructed of copper, aluminum, gold, platinum, palladium, combinations of such or other conductors, and be fabricated using well-known material deposition techniques, such as, plating, sputtering, chemical vapor deposition, combinations of these or the like and patterned as necessary using well-known photolithography and directional etching techniques. The interlevel dielectric layers (564) can be constructed of glass(es) such as SiOx or other types of interlevel dielectric layer materials. Readers will appreciate that the redistribution layer structure (560) is different from the interposer (260) in that the redistribution layer structure (560) is not created on a carrier or interposer wafer, and is instead formed directly on the surface of the dies and encapsulant.

In some implementations, disposed on the inward face of the redistribution layer structure (560) are multiple metal contacts that include signal pads (563, 565, 567, 569) in electrical contact with die I/O pads (547, 549, 557, 559) of the die interfaces (544, 554) and that are formed corresponding pitches. In one example, the conductor structures (562) are fabricated with fine line widths and spacings, on the order of 1.0 μm or less, which can provide high density interconnect pathways between the relatively fine pitch signal pads. In this example, some conductor structures may fan-out interconnect pathways with a lower density from the relatively coarse pitch signal pads, which allows the interconnect pathways to scale out to accommodate connection to the interconnect structures (585). In these examples, some of the conductor structures (562) of the redistribution layer implement high density connections between the group of higher density, finer pitched I/O pads (547, 557) of the semiconductor dies (540, 550) and a lower density connection between the lower density, coarser pitched I/O pads (549, 559) and interconnect structures (585) on the opposing face of the redistribution layer structure (560) for connecting the semiconductor module (540) to a board, wafer, package, or other component. Vias (not shown) in the redistribution layer structure (560) connect interconnect pathways from the I/O pads (549, 559) to interconnect structures (585) (e.g., solder bumps) on the outward face of the redistribution layer structure. In the example implementation depicted in FIG. 5, the redistribution layer structure (560) may be employed as the module-level interconnect structure (145) of the example semiconductor device (100) depicted in FIG. 1.

For further explanation, FIGS. 6A-E set forth an example process flow for constructing a semiconductor module, such as the example implementation of a semiconductor module (500) depicted in FIG. 5, according to various embodiments. Beginning with FIG. 6A, at step 610, diced and sorted dies (640, 650) are reconstituted on a carrier (660). In one example, reconstituting the dies (640, 650) may be carried out by attaching the die interfaces (641, 651) of the dies (640, 650) to the carrier (660) through various well-known bonding techniques. The carrier wafer may include a release layer (not shown) for subsequent removal. The carrier (660) provides mechanical support for the dies (640, 650) and may be composed of glass or other suitable material.

Figure 6A:
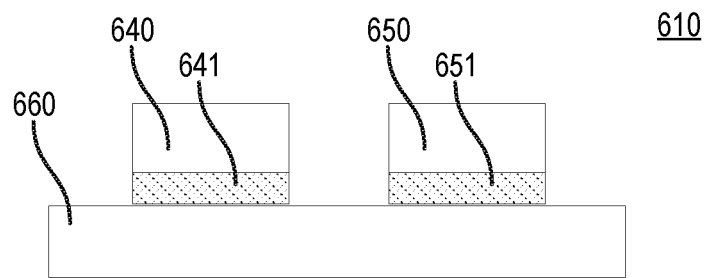
FIG. 6A is a portion of an example process flow for fabricating mixed density interconnect architectures utilizing hybrid fan-out according to some embodiments.
Figure 6B:
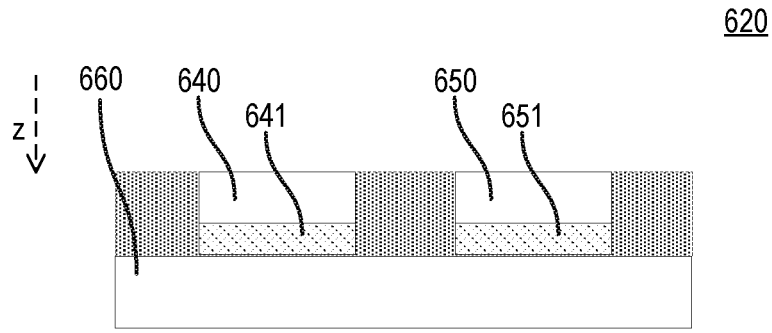
FIG. 6B is a portion of an example process flow for fabricating mixed density interconnect architectures utilizing hybrid fan-out according to some embodiments.

Moving to FIG. 6B, at step 620, device thinning and gap filling are performed. In one example, device thinning and gap filling are carried out by grinding the silicon substrate of the dies (640, 650) to reduce the z-direction height and filling in the area between the dies (640, 650) with an inorganic encapsulant material (625) (e.g., silicon oxide). The encapsulant material (625) is deposited over the semiconductor dies (640, 650), and the otherwise exposed portions of the carrier (660).

Figure 6C:
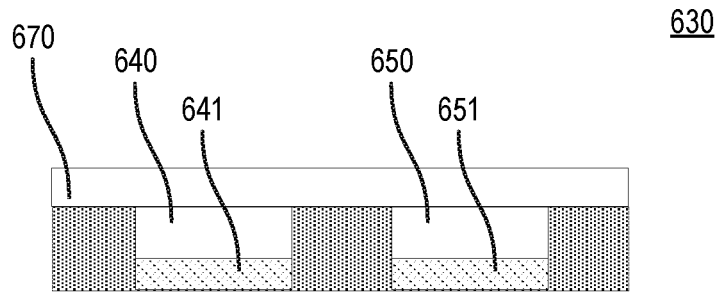
FIG. 6C is a portion of an example process flow for fabricating mixed density interconnect architectures utilizing hybrid fan-out according to some embodiments.

Moving to FIG. 6C, at step 630, the carrier (660) is removed to expose coplanar surfaces of the die interfaces (641, 651) and the encapsulant material (625). In one example, removing the carrier (660) is carried out by adding a top carrier (670) to the top surface (back side) of the encapsulant material (625) to support the encapsulant material (625) and dies (640, 650) during further processing, and removing the carrier (660), for example, by activating the release layer to release the carrier (660) from the encapsulant material (625) and dies (640, 650). For example, the top carrier (670) may be a glass carrier.

Figure 6D:
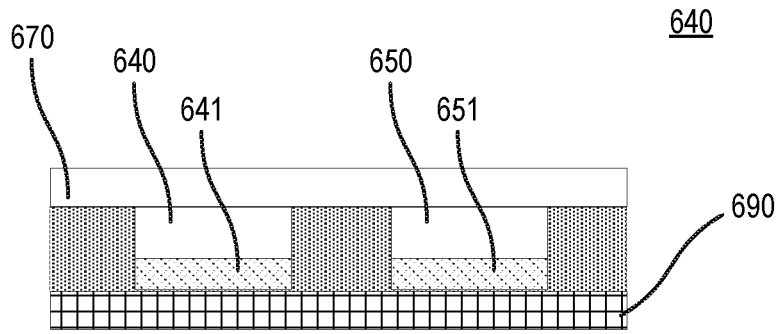
FIG. 6D is a portion of an example process flow for fabricating mixed density interconnect architectures utilizing hybrid fan-out according to some embodiments.

Moving to FIG. 6D, at step 640, a redistribution layer structure (690) is processed on the exposed surfaces of the dies (640, 650) and the encapsulant material (625). As explained above with reference to FIG. 5, the redistribution layer structure (690) may be created to include multiple levels of metallization of and dielectric layers forming interconnect pathways between the dies (640, 650) and interconnect pathways between each die and external interconnect structures such as interconnect structures (585). Die-to-die connectivity is achieved by high density, fine line connection pathways in the redistribution layer structure (690) connecting fine pitch (e.g., ultra-fine pitch) I/O pads of each die (640, 650). Die-to-package interconnect is achieve by lower density connection pathways between group of coarser pitch (e.g., fine pitch) I/O pads to interconnect structures such as bumps or pillars.

Figure 6E:
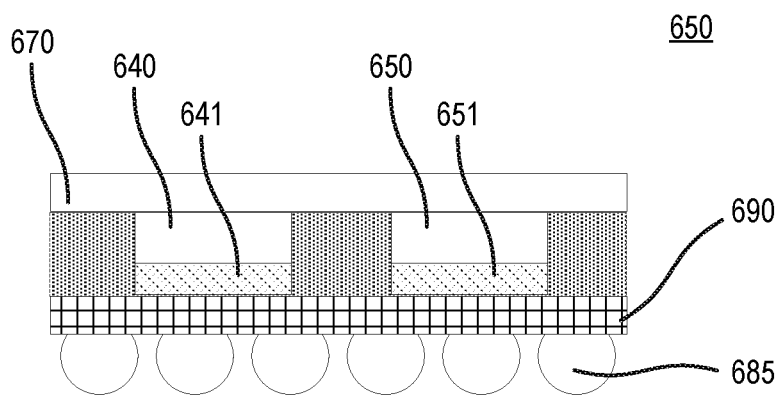
FIG. 6E is a portion of an example process flow for fabricating mixed density interconnect architectures utilizing hybrid fan-out according to some embodiments.

Moving to FIG. 6E, at step 650, interconnect structures (685) are formed on the exposed face of the redistribution layer structure (690). In one example, forming interconnect structures on the exposed face of the redistribution layer structure (690) is carried out by attaching solder bumps to the redistribution layer structure (690). In some examples, the mounting can be accompanied by or performed in conjunction with the fabrication of underbump metallization (UBM). At this point, the fan-out package (495) can be mounted to a circuit board, wafer, package, or other interconnect structure.

Figure 7:
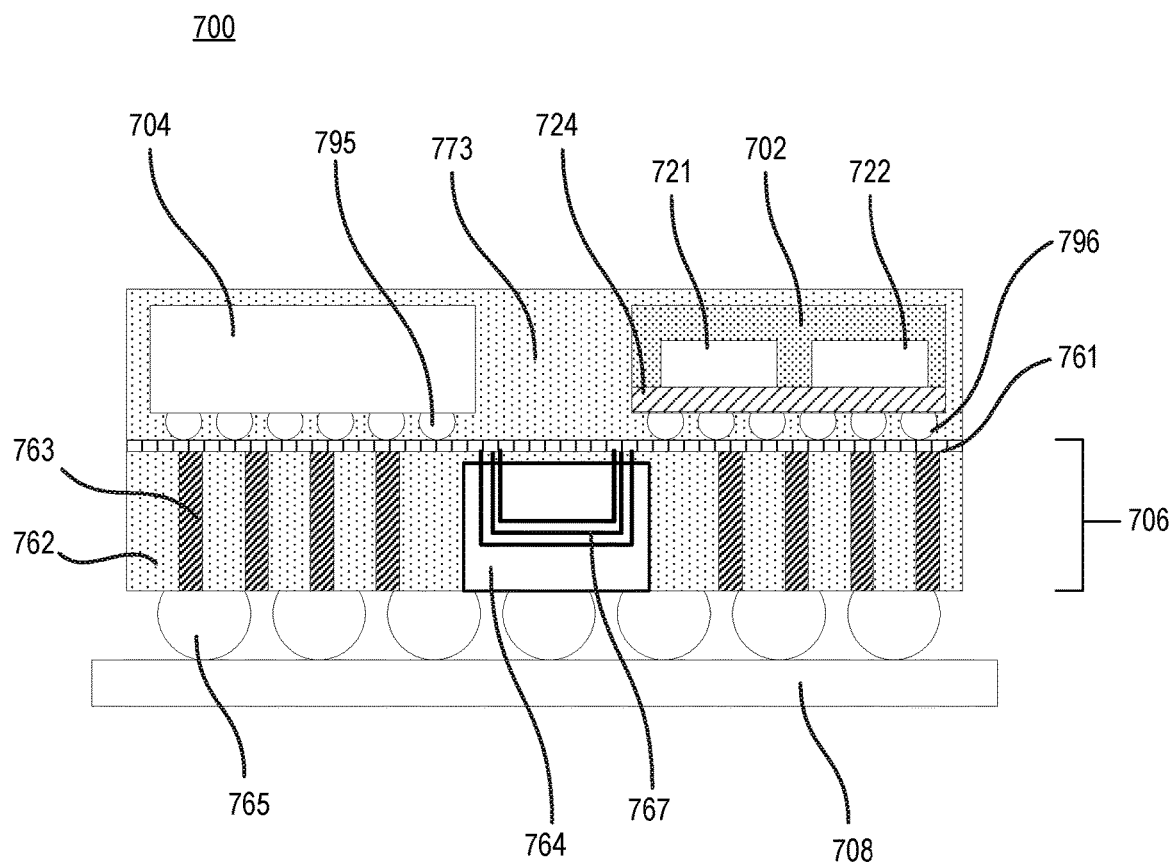
FIG. 7 sets forth a block diagram of an example semiconductor device for mixed density interconnect architectures utilizing hybrid fan-out according to some embodiments of the present disclosure.

For further explanation, FIG. 7 sets forth a cross-sectional diagram of an example implementation of a semiconductor device (700) according to various embodiments of the present disclosure. In one example, the semiconductor device (700) includes a fan-out multi-chip/multi-die semiconductor module (702), such as the semiconductor module (140) depicted in FIG. 1 or the semiconductor module (200) depicted in FIG. 2 or the semiconductor module (500) depicted in FIG. 5. The semiconductor module (702) implements ultra-high density I/O connection pathways between two or more dies (721, 722) while implementing a lower density of I/O connection pathways in a fan-out structure, which may be implemented by a module-level interconnect structure (724) such as any of the module-level interconnect structures discussed above. In this example, the semiconductor device (700) also includes and a peripheral module (704) (e.g., a memory module) that is coupled to one of the dies in the semiconductor module (702) through an interconnect structure (706), although readers will appreciate that additional (heterogenous or homogenous) peripheral modules may be included for connection to other dies in the semiconductor module. Continuing this example, the semiconductor module (702) and peripheral module (704) are also connected to a device substrate (708) through the interconnect structure (706). In some examples, an underfill material is interposed between the interconnect structure (706) and the substrate (708). In one example, the semiconductor module (702) and the peripheral module (704) are coupled to the interconnect structure by conductive bumps (795, 796).

In the example implementation depicted in FIG. 7, the interconnect structure (706) includes a redistribution layer (761) formed on an encapsulant layer (762) having embedded therein multiple conductive pillars (763) and an interconnecting die (764). In some examples, the redistribution layer (761) includes connection pathways for routing I/O signals between the interconnect die (764) and the semiconductor module (702) and between the interconnect die (764) and the peripheral module (704), among others. The redistribution layer (761) implements high density I/O connection pathways between the high density integrated fan-out interconnects of the semiconductor module (702) and the interconnect die (764). The redistribution layer (761) also implements high density I/O connection pathways between the high density interconnects of the peripheral module (704) and the interconnect die (764). The redistribution layer (761) may include multiple layers of conductor structures (not shown), such as traces, pads, vias and other types of conductor structures suitable for fabrication, and multiple interlevel dielectric layers (not shown). In one example, the conductor structures are fabricated with fine line widths and spacings, on the order of 1.0 µm or less, which can provide high density interconnect pathways between the relatively fine pitch signal pads. In various examples, the conductor structures can be constructed of copper, aluminum, gold, platinum, palladium, combinations of such or other conductors, and be fabricated using well-known material deposition techniques, such as, plating, sputtering, chemical vapor deposition, combinations of these or the like and patterned as necessary using well-known photolithography and directional etching techniques. The interlevel dielectric layers can be constructed of glass(es) such as SiOx or other types of interlevel dielectric layer materials.

In some implementations, the interconnect die (764) is designed to provide a high-density cross link between the semiconductor module (702) and the peripheral module (704) for high speed signal transmission also by way of the redistribution layer (761). The interconnect die (764) includes an interconnect structure (767), which includes traces and vias that bridge areas of the redistribution layer (761).

In some examples, the encapsulant layer (762) is composed of an epoxy or other polymer material that exhibits suitable viscosity at the applicable molding temperatures and has molding temperatures lower than the melting points of any of the solder structures present at the time of the molding processes. In some examples, similar encapsulant layer (773) is molded over the semiconductor module (702), peripheral module (704) and exposed portions of the redistribution layer (761).

In some examples, the conductive pillars (763) provide conductive pathways to redistribution layer (761) and thus to the semiconductor module (702), the peripheral module (704) and the interconnecting die (764). The conductive pillars (763) may be composed of a conductive metal such as copper, or another conductive metal. Conductive bumps (765) are applied to the conductive pillars (763). The conductive bumps (765) provide solderable connection points for bonding to the substrate (708). For example, the conductive bumps (765) include copper, a tin-silver alloy, or another conductive material suitable for solderable connections. Thus, the conductive bumps (765) and conductive pillars (763) provide a conductive pathway from the surface of the substrate (708) to the redistribution layer (761) connecting the semiconductor module (702), peripheral module (704), and interconnecting die (764) for providing the conveyance of input/output signals, power, and ground to those components.

Readers will appreciate that the mixed density interconnect architecture utilizing hybrid fan-out described above provides high density connection pathways between individual die of a multi-die module and a peripheral module such as a memory interface, while still achieving ultra-high density die-to-die connections within the multi-die module, through the utilization of mixed density I/O pitches as well as through the utilization of the high density cross-link die.

For further explanation, FIGS. 8A-E set forth an example process flow for constructing a semiconductor device, such as the example implementation of a semiconductor device (700) depicted in FIG. 7, according to various embodiments. Beginning with FIG. 8A, at step 810, conductive pillars (863) are created on a carrier (812). Creating conductive pillars (863) on a carrier (812) may be carried out by various well-known techniques. In one example, creating conductive pillars (863) on a carrier (812) is carried out by depositing a release layer (not shown) and a plating seed layer (not shown), and by performing a plating process to plate the conductive pillars (863) using a photoresist mask that is subsequently removed. In some examples, the conductive pillars (863) are composed of copper. In some examples, the carrier (812) is a glass carrier.

Figure 8A:
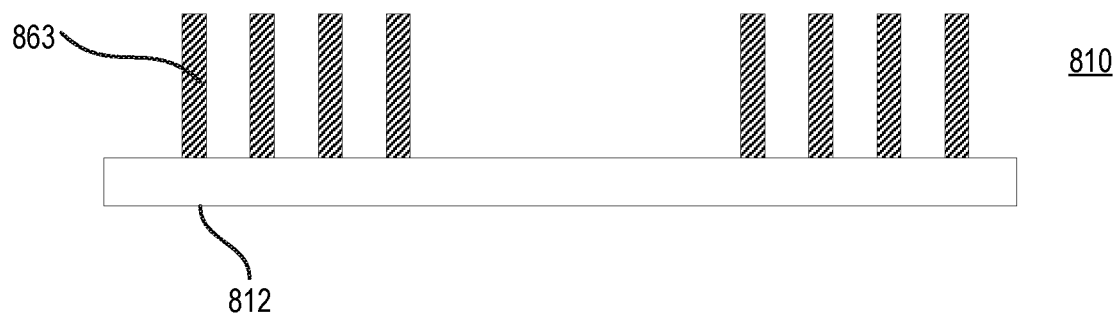
FIG. 8A is a portion of an example process flow for fabricating mixed density interconnect architectures utilizing hybrid fan-out according to some embodiments.
Figure 8B:
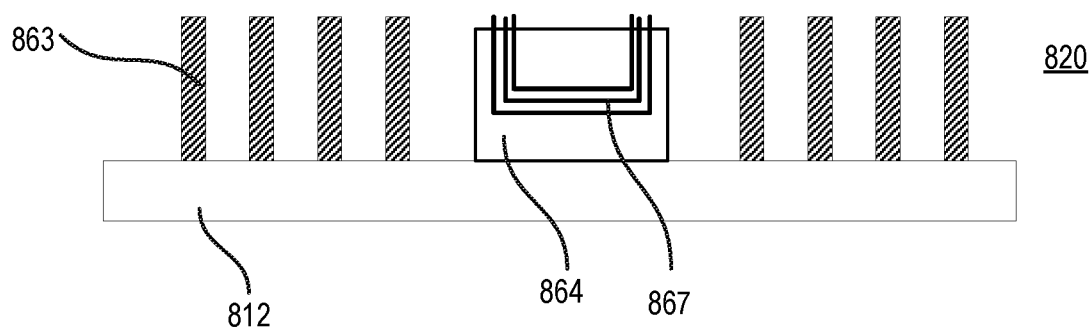
FIG. 8B is a portion of an example process flow for fabricating mixed density interconnect architectures utilizing hybrid fan-out according to some embodiments.

Moving to FIG. 8B, at step 820, an interconnect die (864) including an interconnect structure (867) is attached to the carrier (812). In one example, attaching the interconnect die (864), such as the interconnect die (764), is carried out by mounting the interconnect die (864) with die attach film contacting the release layer of the carrier (812).

Figure 8C:
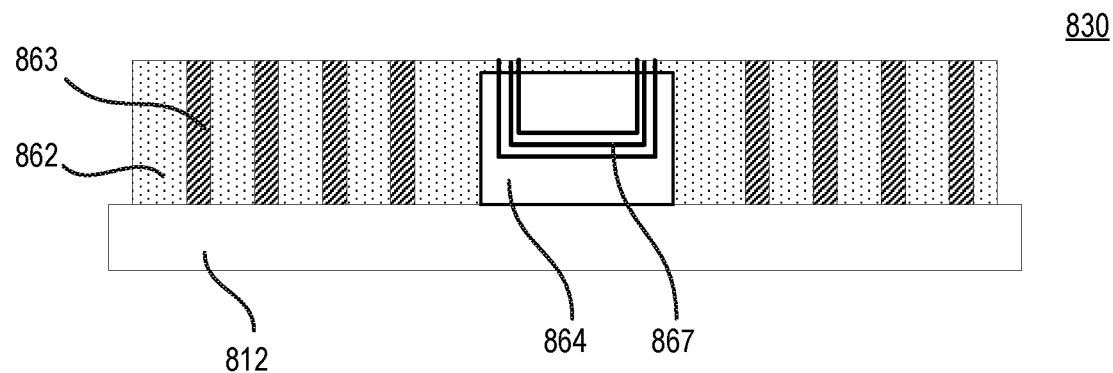
FIG. 8C is a portion of an example process flow for fabricating mixed density interconnect architectures utilizing hybrid fan-out according to some embodiments.

Moving to FIG. 8C, at step 830, an encapsulant layer (862) is deposited. In example, depositing the encapsulant layer (862) is carried out by molding suitable encapsulant material on the conductive pillars (863) and the interconnect die (864) with the carrier (812) in place, and grinding or etching the encapsulant material to expose the tops of the conductive pillars and the interconnect structure (867) of the interconnect die (864).

Figure 8D:
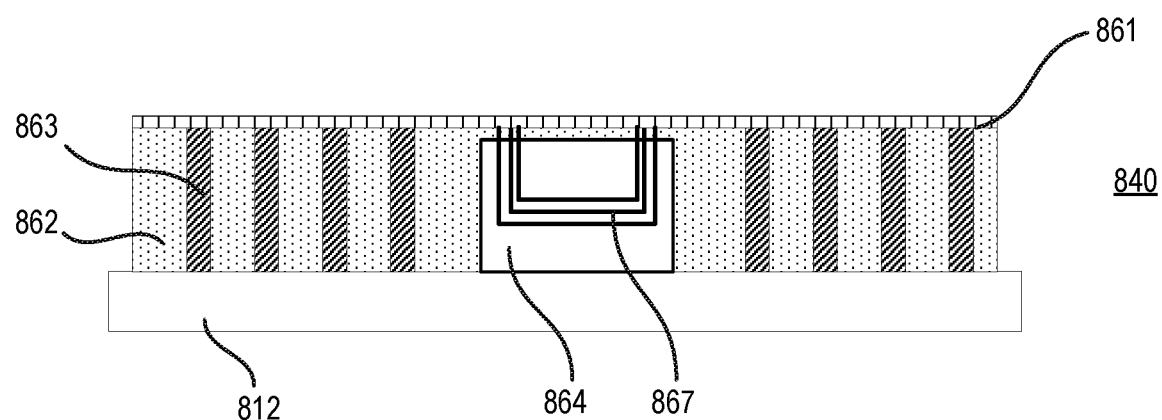
FIG. 8D is a portion of an example process flow for fabricating mixed density interconnect architectures utilizing hybrid fan-out according to some embodiments.

Moving to FIG. 8D, at step 840, a redistribution layer (861) is fabricated on the encapsulant layer (862), exposed conductive pillars (863), and the interconnect structure (867) of the interconnect die (864). In one example, fabricating the redistribution layer (861) is carried out such that various conductor structures of the redistribution layer (861) are fabricated in metallurgical contact with the conductive pillars (863) and the interconnect structure (867) of the interconnect die (864). Fabrication techniques discussed above can be used to construct the redistribution layer (861).

Figure 8E:
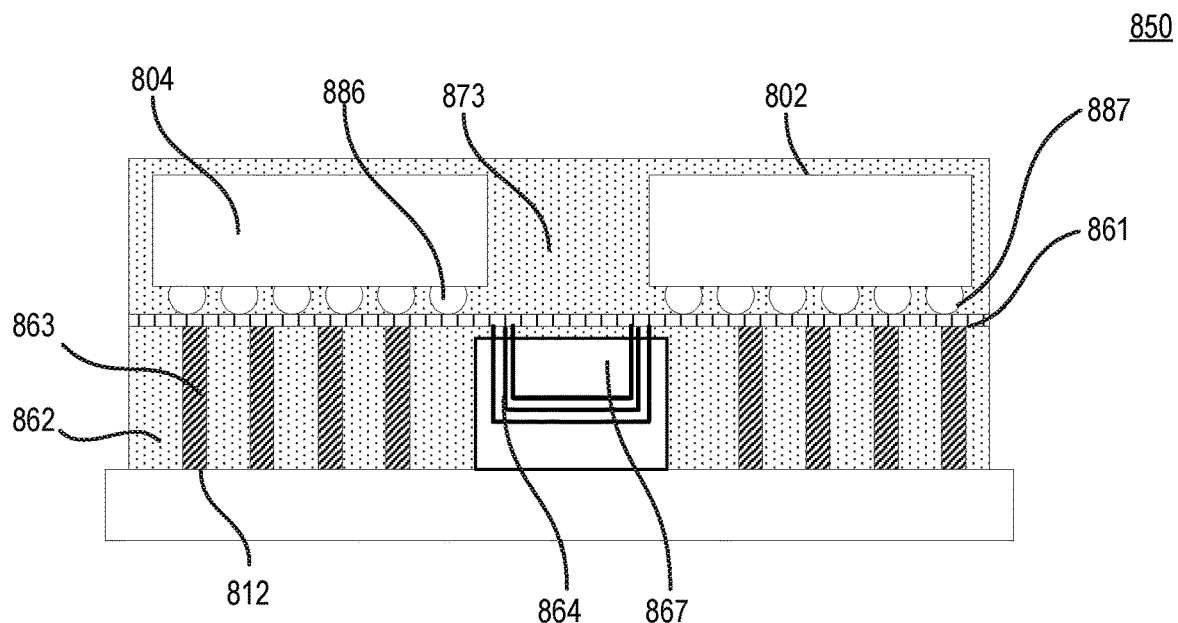
FIG. 8E is a portion of an example process flow for fabricating mixed density interconnect architectures utilizing hybrid fan-out according to some embodiments.

Moving to FIG. 8E, at step 850, the semiconductor module (802) and the peripheral module (804) are mounted on the redistribution layer (861). In one example, mounting the semiconductor module (802) and the peripheral module (804) on the redistribution layer (861) is carried out by bonding interconnects (886, 887) of the semiconductor module (802) and the peripheral module (804) to the redistribution layer (861) through suitable bonding techniques. Subsequently, a molding layer (873) is formed on and around the semiconductor module (802) and the peripheral module (804).

Figure 8F:
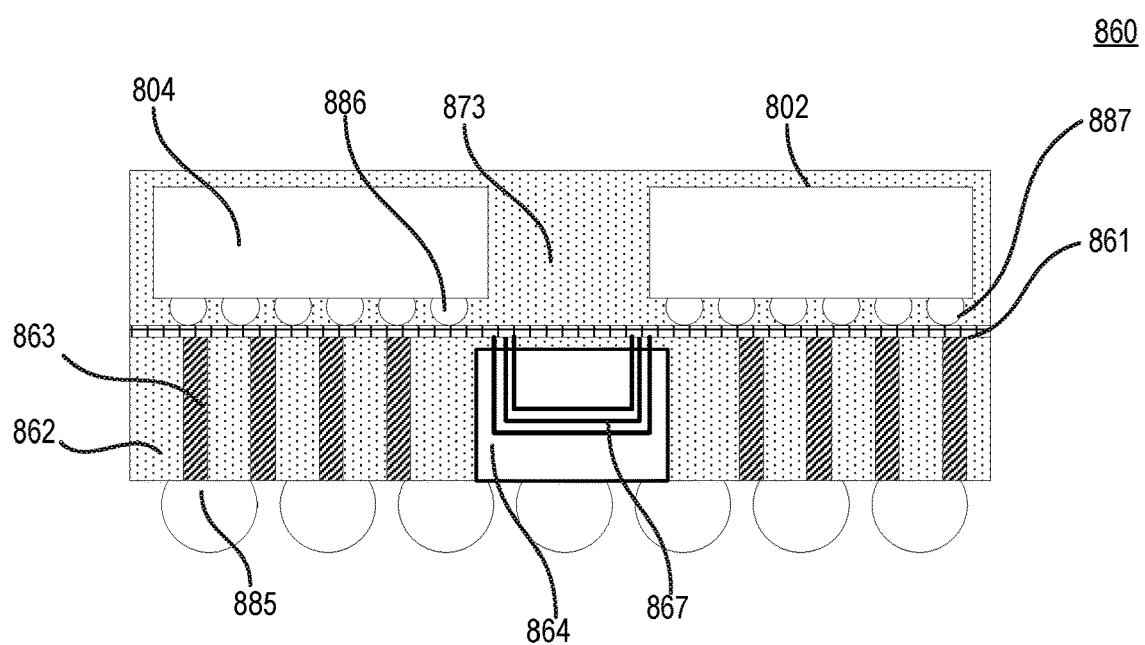
FIG. 8F is a portion of an example process flow for fabricating mixed density interconnect architectures utilizing hybrid fan-out according to some embodiments.

Moving to FIG. 8F, at step 860, interconnects (885) are attached to the conductive pillars (863). In one example, attaching interconnects (885) to the conductive pillars (863) is carried out by releasing the carrier (812) (e.g., by activating the release layer) and attaching interconnects (885) (e.g., solder bumps) to the conductive pillars.

Figure 9:
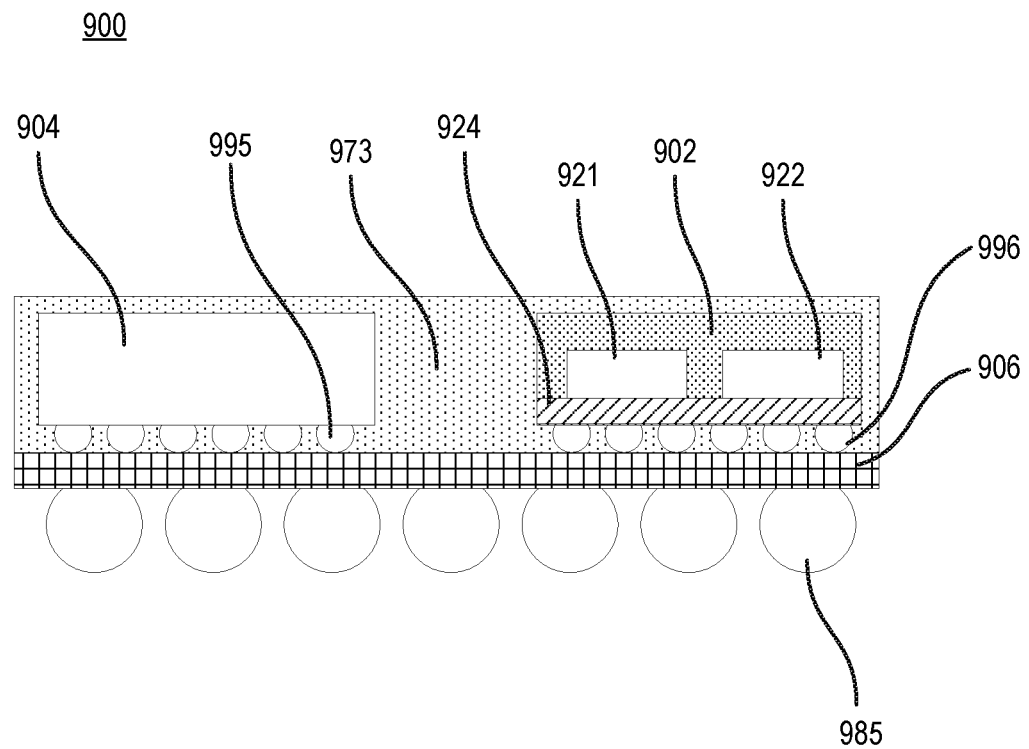
FIG. 9 sets forth a block diagram of an example semiconductor device for mixed density interconnect architectures utilizing hybrid fan-out according to some embodiments of the present disclosure.

For further explanation, FIG. 9 sets forth a cross-sectional diagram of an example implementation of a semiconductor device (900) according to various embodiments of the present disclosure. In one example, the semiconductor device (900) includes a fan-out multi-chip/multi-die semiconductor module (902), such as the semiconductor module (140) depicted in FIG. 1 or the semiconductor module (200) depicted in FIG. 2 or the semiconductor module (500) depicted in FIG. 5. The semiconductor module (902) implements ultra-high density I/O connection pathways between two or more dies (921, 922) while implementing a lower density of I/O connection pathways in a fan-out structure, which may be implemented by a module-level interconnect structure (924) such as any of the module-level interconnect structures discussed above. In this example, the semiconductor device (900) also includes and a peripheral module (904) (e.g., a memory module) that is connected to one of the dies in the semiconductor module (902) through redistribution layer structure (906), although readers will appreciate that additional (heterogenous or homogenous) peripheral modules may be included for connection to other dies in the semiconductor module. In one example, the semiconductor module (902) and the peripheral module (904) are coupled to the interconnect structure by conductive bumps (995, 996). In some examples, an encapsulant layer (973) is molded over the semiconductor module (902), peripheral module (904) and exposed portions of the redistribution layer structure (906). The encapsulant layer (762) may be composed of an epoxy or other polymer material that exhibits suitable viscosity at the applicable molding temperatures and has molding temperatures lower than the melting points of any of the solder structures present at the time of the molding processes.

In the example implementation depicted in FIG. 9, the redistribution layer structure (906) includes connection pathways for routing I/O signals between the semiconductor module (902) and the peripheral module (904). The redistribution layer structure (906) implements high density wafer-level fan-out I/O connection pathways between the integrated high density fan-out interconnects of the semiconductor module (902) and the high density interconnects of the peripheral module (904). The redistribution layer structure (906) may include multiple layers of conductor structures (not shown), such as traces, pads, vias and other types of conductor structures suitable for fabrication, and multiple interlevel dielectric layers (not shown). In one example, the conductor structures are fabricated with fine line widths and spacings, on the order of 1.0 μm or less, which can provide high density interconnect pathways between the relatively fine pitch signal pads. In various examples, the conductor structures can be constructed of copper, aluminum, gold, platinum, palladium, combinations of such or other conductors, and be fabricated using well-known material deposition techniques, such as, plating, sputtering, chemical vapor deposition, combinations of these or the like and patterned as necessary using well-known photolithography and directional etching techniques. The interlevel dielectric layers can be constructed of glass (es) such as SiOx or other types of interlevel dielectric layer materials. In some examples, interconnect structure (985) (e.g., solder bumps) are disposed on the redistribution layer structure (906) through various well-known techniques, and electrically coupled to a metallization layer in the redistribution layer structure (906). In some examples, the interconnect structures (985) provide connection pathways between the above-identified components of the semiconductor device (900) and a substrate, card, wafer, or other circuit board (not shown).

Readers will appreciate that the mixed density interconnect architecture utilizing hybrid fan-out described above provides high density connection pathways between individual die of a multi-die module and a peripheral module such as a memory interface, while still achieving ultra-high density die-to-die connections within the multi-die module, through the utilization of mixed density I/O pitches as well as through the utilization of a wafer-level fan-out redistribution layer.

For further explanation, FIGS. 10A-D set forth an example process flow for constructing a semiconductor device, such as the example implementation of a semiconductor device (900) depicted in FIG. 9, according to various embodiments. Beginning with FIG. 10A, at step 1010, a redistribution layer (1006) is created on a carrier (1012). In one example, a wafer-level fan-out structure is created in various metallization layers through various techniques for constructing a redistribution layer as described above. The carrier (1012) may be composed of glass or another suitable material for supporting the redistribution layer (1006), and may include a release layer (not shown).

Figure 10A:
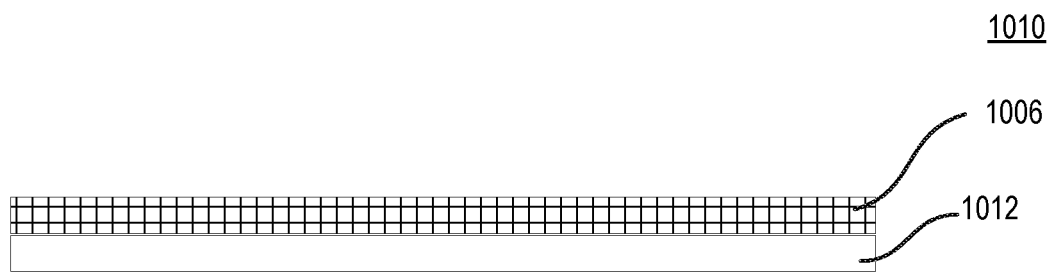
FIG. 10A is a portion of an example process flow for fabricating mixed density interconnect architectures utilizing hybrid fan-out according to some embodiments.
Figure 10B:
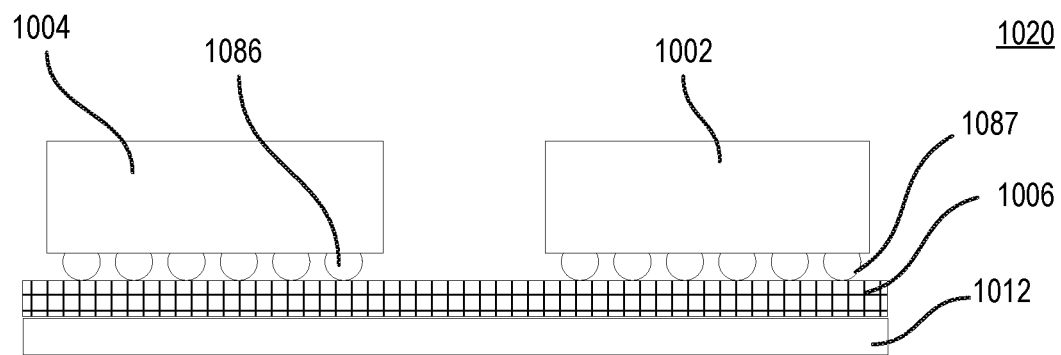
FIG. 10B is a portion of an example process flow for fabricating mixed density interconnect architectures utilizing hybrid fan-out according to some embodiments.

Moving to FIG. 10B, at step 1020, the semiconductor module (1002) (e.g., semiconductor module (902) and the peripheral module (1004) are mounted on the redistribution layer (1006). In one example, mounting the semiconductor module (1002) and the peripheral module (1004) on the redistribution layer (1006) is carried out by bonding interconnects (1086, 1087) of the semiconductor module (1002) and the peripheral module (1004) to the redistribution layer (1006) through suitable bonding techniques.

Figure 10C:
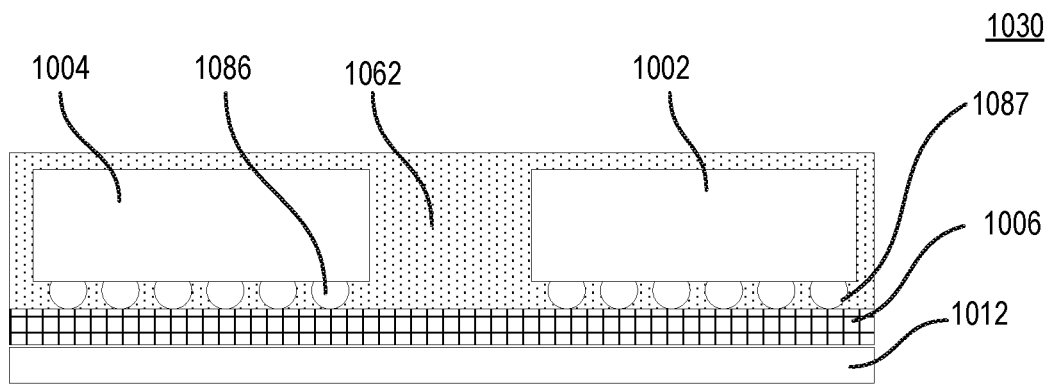
FIG. 10C is a portion of an example process flow for fabricating mixed density interconnect architectures utilizing hybrid fan-out according to some embodiments.

Moving to FIG. 10C, at step 1030, an encapsulant layer (1062) is deposited. In one example, depositing the encapsulant layer (1062) is carried out by molding suitable encapsulant material on and around the semiconductor module (1002) and the peripheral module (1004) and on exposed portions of the redistribution layer (1006).

Figure 10D:
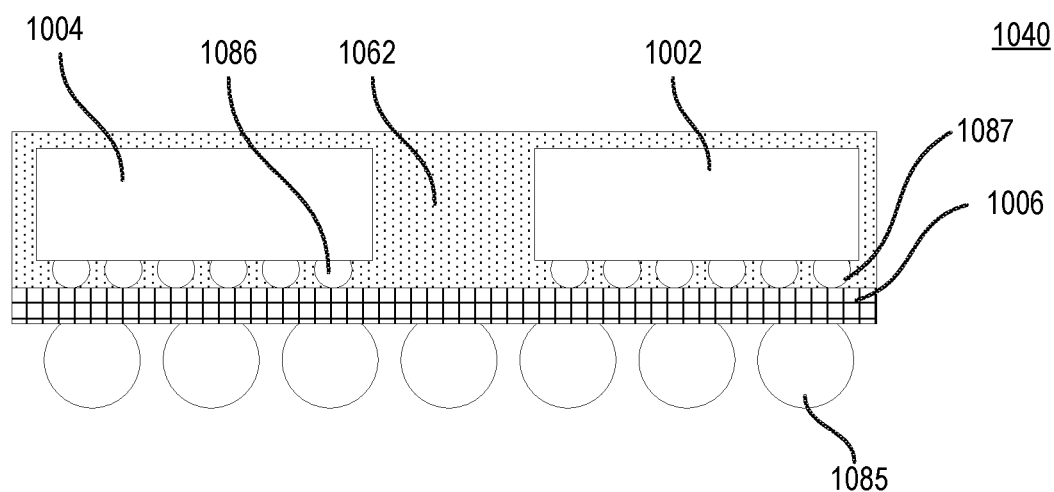
FIG. 10D is a portion of an example process flow for fabricating mixed density interconnect architectures utilizing hybrid fan-out according to some embodiments.

Moving to FIG. 10D, at step 1040, interconnects (1085) are attached to the redistribution layer (1006). In one example, attaching interconnects (885) to the conductive pillars (863) is carried out by releasing the carrier (1012) (e.g., by activating the release layer) or otherwise removing the carrier (e.g., by grinding) and attaching interconnects (1085) (e.g., solder bumps) to conductor pads in the redistribution layer (1006), for example, using techniques discussed above.

Figure 11:
FIG. 11 is a flowchart of an example method of fabricating mixed density interconnect architectures utilizing hybrid fan-out according to some embodiments.

For further explanation, FIG. 11 sets forth a flow chart illustrating an exemplary method for mixed density interconnect architectures utilizing hybrid fan-out that includes coupling (1102) a first die to a second die using a first plurality of interconnects having a first density. In one example, coupling (1102) a first die to a second die using a first plurality of interconnects having a first density is carried out by bonding the first die and the second die to a redistribution layer of an interposer using hybrid bonding. In this example, coupling (1102) a first die to a second die using a first plurality of interconnects having a first density may be carried out through the example process flow depicted in FIGS. 4A-F. In another example, coupling (1102) a first die to a second die using a first plurality of interconnects having a first density is carried out by fabricating a redistribution layer on the first die and the second die. In this example, coupling (1102) a first die to a second die using a first plurality of interconnects having a first density may be carried out through the example process flow depicted in FIGS. 6A-D.

The example method of FIG. 11 also includes coupling (1104) the first die to a peripheral module using a second plurality of interconnects having a second density that is different from first density (e.g., the second density is less than the first density). In one example, coupling (1104) the first die to a peripheral module using a second plurality of interconnects having a second density that is different from the first density is carried out by coupling an interconnect die to the first die and to the peripheral module. In this example, coupling (1104) the first die to a peripheral module using a second plurality of interconnects having a second density that is different from the first density may be carried out through the example process flow depicted in FIG. 8A-F. In another example, coupling (1104) the first die to a peripheral module using a second plurality of interconnects having a second density that is different from the first density is carried out by coupling the first die to the peripheral module using a wafer-level fan-out structure of an interposer. In this example, coupling (1104) the first die to a peripheral module using a second plurality of interconnects having a second density that is different from the first density may be carried out through the example process flow depicted in FIGS. 10A-D.

In view of the explanations set forth above, readers will recognize that the benefits of mixed density interconnect architectures utilizing hybrid fan-out include: increased input/output performance by providing a mixed density of interconnections that allows some dies to be tightly coupled with ultra-high density connection pathways; increased scalability and compatibility with external devices by providing a mixed density of interconnections that allows some dies to be less tightly coupled with high density connection pathways; enhanced integration of heterogenous dies in a single package.

It will be understood from the foregoing description that modifications and changes can be made in various embodiments of the present disclosure. The descriptions in this specification are for purposes of illustration only and are not to be construed in a limiting sense. The scope of the present disclosure is limited only by the language of the following claims.

What is claimed is:

1. A semiconductor device comprising:
    a semiconductor module including:
        first and second dies each including a mixed density of input/output interconnects on a first die surface, the mixed density of input/output interconnects comprising a first group of interconnects and a second group of interconnects, the first group of interconnects having an interconnect density that is different from the second group of interconnects; and
        a first interconnect structure including a first plurality of connection pathways and a second plurality of connection pathways fabricated together in a same redistribution layer structure, the first plurality of connection pathways directly connecting the first group of interconnects on the first die to the first group of interconnects on the second die, the second plurality of connection pathways connecting the second group of interconnects on the first die to one or more package interconnects, wherein a first pathway density of the first plurality of connection pathways is different from a pathway density of the second pathway density;
    one or more peripheral components external to the semiconductor module; and
    a second interconnect structure connecting the semiconductor module to the one or more peripheral components, wherein the second interconnect structure includes an interconnect die coupled to the second plurality of connection pathways.

2. The semiconductor device of claim 1, wherein the redistribution layer is fabricated on the die surface of the first die, the die surface of the second die, and a mold layer supporting the first die and second die.

3. The semiconductor device of claim 1, wherein the redistribution layer is part of an interposer that is coupled to the first die and the second die.

4. The semiconductor device of claim 1, wherein the first group of interconnects of the first die and the second die for die-to-die communication have a pitch that is finer than a pitch of the second group of interconnects of the first die and the second die.

5. The semiconductor device of claim 1, wherein the interconnect die is connected to the semiconductor module and to the peripheral component through a redistribution layer formed on a surface of the second interconnect structure.

6. The semiconductor device of claim 1, wherein the second interconnect structure includes a wafer-level fan-out redistribution structure fabricated on an interposer.

7. A method of fabricating a mixed density interconnect architecture utilizing hybrid fan-out, the method comprising:
    providing a semiconductor module including:
        first and second dies each including a mixed density of input/output interconnects on a first die surface, the mixed density of input/output interconnects comprising a first group of interconnects and a second group of interconnects, the first group of interconnects having an interconnect density that is different from the second group of interconnects; and
        a first interconnect structure including a first plurality of connection pathways and a second plurality of connection pathways fabricated together in a same redistribution layer structure, the first plurality of connection pathways directly connecting the first group of interconnects on the first die to the first group of interconnects on the second die, the second plurality of connection pathways connecting the second group of interconnects on the first die to one or more package interconnects, wherein a first pathway density of the first plurality of connection pathways is different from a pathway density of the second pathway density; and
    coupling the semiconductor module to one or more peripheral components via a second interconnect structure, the second interconnect structure including an interconnect die coupled to the second plurality of connection pathways.

8. The method of claim 7, wherein the redistribution layer is fabricated on the die surface of the first die, the die surface of the second die, and a mold layer supporting the first die and second die.

9. The method of claim 7, wherein the redistribution layer is part of an interposer that is coupled to the first die and the second die.

10. The method of claim 7, wherein the first group of interconnects of the first die and the second die for die-to-die communication have a pitch that is finer than a pitch of the second group of interconnects of the first die and the second die.

11. The method of claim 7, wherein the second interconnect structure includes an interconnect die in the second plurality of connection pathways.

12. The method of claim 11, wherein the interconnect die is connected to the semiconductor module and to the peripheral component through a redistribution layer formed on a surface of the second interconnect structure.

13. The method of claim 7, wherein the second interconnect structure includes a wafer-level fan-out redistribution structure fabricated on an interposer.

14. A computing device comprising:
a substrate;
a semiconductor device coupled to the substrate, the semiconductor device comprising:
a semiconductor module including:
first and second dies each including a mixed density of input/output interconnects on a first die surface, the mixed density of input/output interconnects comprising a first group of interconnects and a second group of interconnects, the first group of interconnects having an interconnect density that is different from the second group of interconnects; and
a first interconnect structure including a first plurality of connection pathways and a second plurality of connection pathways fabricated together in a same redistribution layer structure, the first plurality of connection pathways directly connecting the first group of interconnects on the first die to the first group of interconnects on the second die, the second plurality of connection pathways connecting the second group of interconnects on the first die to one or more package interconnects, wherein a first pathway density of the first plurality of connection pathways is different from a pathway density of the second pathway density;
one or more peripheral components external to the semiconductor module; and
a second interconnect structure connecting the semiconductor module to the one or more peripheral components, wherein the second interconnect structure includes an interconnect die coupled to the second plurality of connection pathways.

15. The computing device of claim 14, wherein the redistribution layer is fabricated on the die surface of the first die, the die surface of the second die, and a mold layer supporting the first die and second die.

16. The computing device of claim 14, wherein the redistribution layer is part of an interposer that is coupled to the first die and the second die.

17. The computing device of claim 14, wherein the first group of interconnects of the first die and the second die for die-to-die communication have a pitch that is finer than a pitch of the second group of interconnects of the first die and the second die.

18. The computing device of claim 14, wherein the interconnect die is connected to the semiconductor module and to the peripheral component through a redistribution layer formed on a surface of the second interconnect structure.

19. The computing device of claim 14, wherein the second interconnect structure includes a wafer-level fan-out redistribution structure fabricated on an interposer.

* * * * *